(12) United States Patent
Kim et al.

(10) Patent No.: US 7,733,691 B2
(45) Date of Patent: Jun. 8, 2010

(54) MEMORY DEVICE INCLUDING THERMAL CONDUCTOR LOCATED BETWEEN PROGRAMMABLE VOLUMES

(75) Inventors: Young-Tae Kim, Incheon (KR); Myung-Jin Park, Seongnam-si (KR); Keun-Ho Lee, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/959,502

(22) Filed: Dec. 19, 2007

(65) Prior Publication Data

US 2008/0165574 A1    Jul. 10, 2008

(30) Foreign Application Priority Data

Jan. 8, 2007    (KR) .................... 10-2007-0002149

(51) Int. Cl.
 *G11C 11/00*    (2006.01)
(52) U.S. Cl. ...................................... 365/163; 365/173
(58) Field of Classification Search ................. 365/163, 365/173
 See application file for complete search history.

(56) References Cited

U.S. PATENT DOCUMENTS

| | | | |
|---|---|---|---|
| 6,087,674 A | 7/2000 | Ovshinsky et al. | |
| 6,478,113 B1 | 11/2002 | Ellison | |
| 6,480,438 B1 | 11/2002 | Park | |
| 6,531,391 B2 | 3/2003 | Zahorik | |
| 2006/0092694 A1* | 5/2006 | Choi et al. | 365/163 |
| 2006/0110878 A1* | 5/2006 | Lung et al. | 438/253 |
| 2006/0237756 A1* | 10/2006 | Park et al. | 257/296 |
| 2007/0063180 A1* | 3/2007 | Asano et al. | 257/3 |
| 2007/0096074 A1* | 5/2007 | Asano et al. | 257/4 |
| 2008/0157053 A1* | 7/2008 | Lai et al. | 257/4 |

FOREIGN PATENT DOCUMENTS

| | | |
|---|---|---|
| KR | 1020050071965 A | 8/2005 |
| KR | 1020050110680 A | 11/2005 |
| KR | 1020060016418 A | 2/2006 |
| KR | 1020060079455 A | 7/2006 |
| KR | 1020070080603 A | 8/2007 |
| WO | WO 2006/084857 A1 | 8/2006 |

* cited by examiner

*Primary Examiner*—Michael T Tran
(74) *Attorney, Agent, or Firm*—Volentine & Whitt, PLLC

(57) ABSTRACT

In one aspect, a memory device is provided which includes a plurality of bit lines extending in a first direction, a plurality of word lines extending in a second direction, an array of programmable volumes electrically connected between the bit lines and word lines, and thermally conductive striped patterns located between the programmable volumes of the array and extending in at least one of the first and second directions.

38 Claims, 17 Drawing Sheets

Fig. 5A

| 10_1 | 10_2 | 10_3 | 10_4 | 10_5 | 10_6 | 10_7 | 10_8 |
|------|------|------|------|------|------|------|------|
| BLK7 | BLK7 | BLK7 | BLK7 | BLK7 | BLK7 | BLK7 | BLK7 |
| BLK6 | BLK6 | BLK6 | BLK6 | BLK6 | BLK6 | BLK6 | BLK6 |
| BLK5 | BLK5 | BLK5 | BLK5 | BLK5 | BLK5 | BLK5 | BLK5 |
| BLK4 | BLK4 | BLK4 | BLK4 | BLK4 | BLK4 | BLK4 | BLK4 |
| BLK3 | BLK3 | BLK3 | BLK3 | BLK3 | BLK3 | BLK3 | BLK3 |
| BLK2 | BLK2 | BLK2 | BLK2 | BLK2 | BLK2 | BLK2 | BLK2 |
| BLK1 | BLK1 | BLK1 | BLK1 | BLK1 | BLK1 | BLK1 | BLK1 |
| BLK0 | BLK0 | BLK0 | BLK0 | BLK0 | BLK0 | BLK0 | BLK0 |
| SA/WD(20_1) || SA/WD(20_2) || SA/WD(20_3) || SA/WD(20_4) ||
| PERIPHERY(30) |||||||||
| SA/WD(20_8) || SA/WD(20_7) || SA/WD(20_6) || SA/WD(20_5) ||
| BLK7 | BLK7 | BLK7 | BLK7 | BLK7 | BLK7 | BLK7 | BLK7 |
| BLK6 | BLK6 | BLK6 | BLK6 | BLK6 | BLK6 | BLK6 | BLK6 |
| BLK5 | BLK5 | BLK5 | BLK5 | BLK5 | BLK5 | BLK5 | BLK5 |
| BLK4 | BLK4 | BLK4 | BLK4 | BLK4 | BLK4 | BLK4 | BLK4 |
| BLK3 | BLK3 | BLK3 | BLK3 | BLK3 | BLK3 | BLK3 | BLK3 |
| BLK2 | BLK2 | BLK2 | BLK2 | BLK2 | BLK2 | BLK2 | BLK2 |
| BLK1 | BLK1 | BLK1 | BLK1 | BLK1 | BLK1 | BLK1 | BLK1 |
| BLK0 | BLK0 | BLK0 | BLK0 | BLK0 | BLK0 | BLK0 | BLK0 |
| 10_16 | 10_15 | 10_14 | 10_13 | 10_12 | 10_11 | 10_10 | 10_9 |

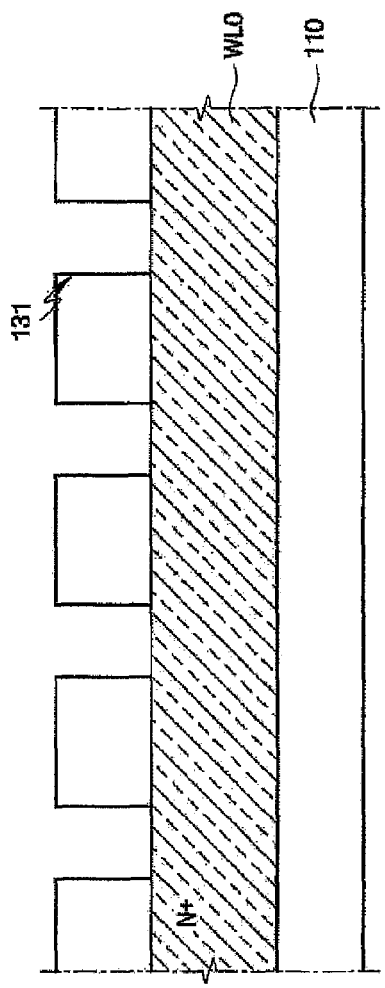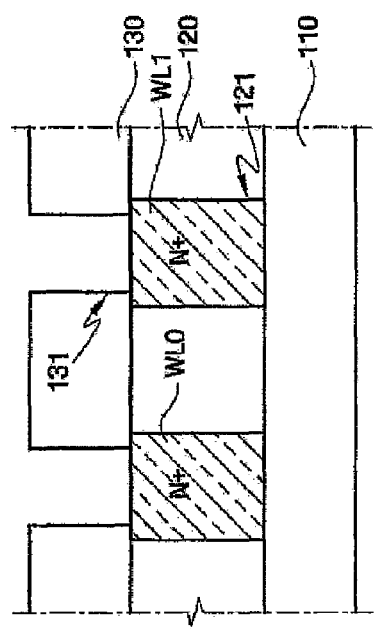
FIG. 7A

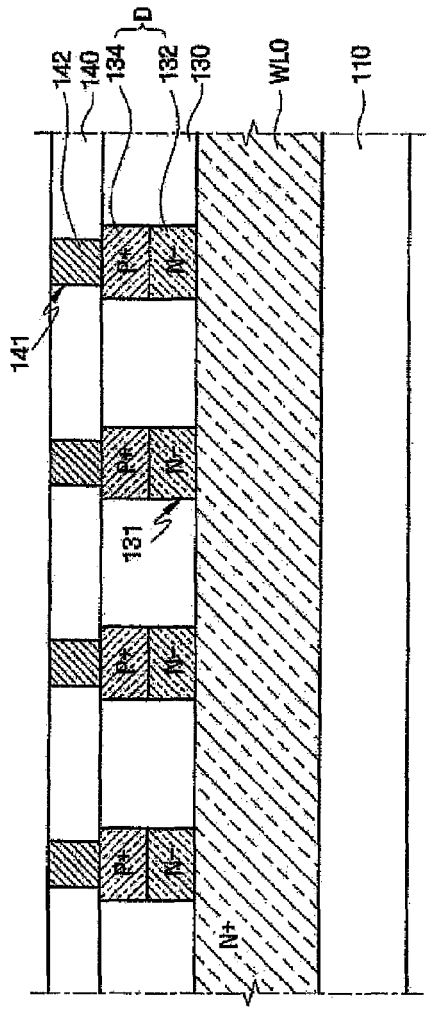
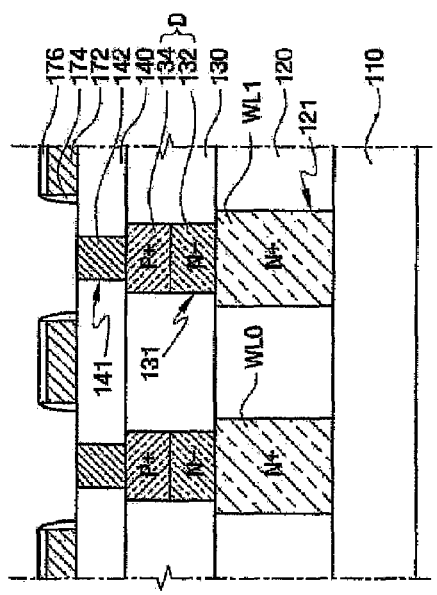
FIG. 7C

US 7,733,691 B2

MEMORY DEVICE INCLUDING THERMAL CONDUCTOR LOCATED BETWEEN PROGRAMMABLE VOLUMES

BACKGROUND OF THE INVENTION

1. Field of the Invention

The present invention relates to semiconductor memory devices, and more particularly, the present invention relates to a memory device having a thermal conductor located between programmable volumes of the memory device.

2. Description of the Related Art

A phase-change random access memory (PRAM), also known as an Ovonic Unified Memory (OUM), includes a phase-change material such as a chalcogenide alloy that is responsive to heat so as to be stably transformed between crystalline and amorphous states. Such a PRAM is disclosed, for example, in U.S. Pat. Nos. 6,487,113 and 6,480,438.

The phase-change material of the PRAM exhibits a relatively low resistance in its crystalline state, and a relatively high resistance in its amorphous state. In conventional nomenclature, the low-resistance crystalline state is referred to as a 'set' state and is designated logic "0", while the high-resistance amorphous state is referred to as a 'reset' state and is designated logic "1".

The terms "crystalline" and "amorphous" are relative terms in the context of phase-change materials. That is, when a phase-change memory cell is said to be in its crystalline state, one skilled in the art will understand that the phase-change material of the cell has a more well-ordered crystalline structure when compared to its amorphous state. A phase-change memory cell in its crystalline state need not be fully crystalline, and a phase-change memory cell in its amorphous state need not be fully amorphous.

Generally, the phase-change material of a PRAM is reset to an amorphous state by heating the material in excess of its melting point temperature for a relatively short period of time. On the other hand, the phase-change material is set to a crystalline state by heating the material below its melting point temperature for a longer period of time. In each case, the material is allowed to quickly cool to its original temperature after the heat treatment.

The speed and stability of the phase-change characteristics of the phase-change material are critical to the performance characteristics of the PRAM. As suggested above, chalcogenide alloys have been found to have suitable phase-change characteristics, and in particular, a compound including germanium (Ge), antimony (Sb) and tellurium (Te) (e.g., $Ge_2Sb_2Te_5$ or "GST") exhibits a stable and high speed transformation between amorphous and crystalline states.

FIGS. 1A and 1B illustrate an example of a memory cell 10 in a 'set' state and in a 'reset' state, respectively, and FIG. 2 is an equivalent circuit diagram of the memory cell 10 of FIGS. 1A and 1B. As shown, the memory cell 10 includes a phase-change element 11 and diode D connected in series between a bit line BL and a word line WL.

It should be noted that the structure of the phase-change element GST is presented as an example only, and that other structures may be possible. Similarly, the connections illustrated in FIGS. 1A, 1B and 2 are presented as examples only, and other configurations are possible. For example, the memory cell 10 may include the phase-change element 11 and a transistor connected in series between the bit line BL and reference potential, with the transistor gated to the word line WL.

In each of FIGS. 1A and 1B, the phase-change element 11 includes a top electrode 12 formed on a phase-change material 14 (e.g., GST). In this example, the top electrode 12 is electrically connected to a bit line BL of a PRAM memory array (not shown). A conductive bottom electrode contact (BEC) 16 is formed between the phase-change material 14 and a conductive bottom electrode 18. The diode D is electrically connected between the bottom electrode 18 and the word line WL of the PRAM cell array (not shown). Specifically, in this example, the N-junction of the diode D is connected to the word line WL and the P-junction of the diode D is connected to the bit line BL via the phase change element 11.

In FIG. 1A, the phase-change material 14 is illustrated as being in its crystalline state. As mentioned previously, this means that the memory cell 10 is in a low-resistance 'set' state or logic 0 state. In FIG. 1B, a portion of the phase-change material 14 is illustrated as being amorphous. Again, this means that the memory cell 10 is in a high-resistance 'reset' state or logic 1 state.

The set and reset states of the memory cell 10 of FIGS. 1A and 1B are establish by controlling the magnitude and duration of current flow through the BEC 16. That is, the memory cell 10 is activated (or accessed) by applying a LOW level voltage to the word line WL. When activated, the phase-change element GST is programmed according to the voltage of the bit line BL. More specifically, the bit line BL voltage is controlled to establish a programming current which causes the BEC 16 to act as a resistive heater which thermally programs the phase-change material 14 in its 'set' and 'reset' states.

FIG. 3 illustrates an example of temperature pulse characteristics of a phase-change material as the phase-change material is programmed in the 'set' and 'reset' states. In particular, reference number 1 denotes the temperature pulse of the phase-change material programmed to its 'reset' state, and reference number 2 denotes the temperature pulse of the phase-change material programmed to its 'set' state.

As shown in FIG. 3, when the phase-change material is programmed to its 'reset' state, the temperature of the material is increased above its melting temperature Tm (e.g., 610° C.) for a relatively short period of time, and then allowed to rapidly cool. In contrast, when the phase-change material is programmed to its 'set' state, the temperature of the material is increased to below its melting point Tm and above its crystallizing temperature Tc (e.g., 450° C.) for a longer period of time, and then allowed to cool more slowly. The fast and slow cooling of the 'reset' and 'set' programming operations are referred to in the art as fast "quenching" and slow "quenching", respectively. The temperature range between the melting temperature Tm and the crystallizing temperature Tc is referred to as the "set window".

As the integration density of the phase-change cells of PRAM devices continues to increase, thermal interference among adjacent cells has become increasingly problematic. That is, as described above in connection with FIG. 3, relatively high temperatures (~450+° C. to 610+° C.) are needed to reliably program each cell. The resultant thermal energy of a cell being programmed can adversely influence the program state of one or more adjacent cells, thus causing inadvertent write errors in the adjacent cells. This problem is further aggravated in configurations employing so-called line type GST patterns. Here, continuous GST patterns are utilized to define the phase-change regions of multiple memory cells. Thermal interference among cells within each GST pattern represents a significant roadblock to minimizing the pitch of the phase-change cell array of the PRAM device.

SUMMARY OF THE INVENTION

According to an aspect of the present invention, a memory device is provided which includes a plurality of bit lines extending in a first direction, a plurality of word lines extending in a second direction, an array of programmable volumes electrically connected between the bit lines and word lines, and thermally conductive striped patterns located between the programmable volumes of the array and extending in at least one of the first and second directions.

According to another aspect of the present invention, a memory device is provided which includes a thermally conductive material located between first and second programmable volumes of adjacent first and second memory cells.

According to still another aspect of the present invention, a memory device is provided which includes a continuous phase-change material pattern extending between adjacent first and second phase-change memory cells, and a thermally conductive pattern embedded in the phase-change material pattern between the first and second phase-change memory cells.

According to yet another aspect of the present invention, a memory device is provided which includes a plurality of phase-change material patterns extending parallel to each other in a first direction, each of the phase-change material patterns including a plurality of phase-change regions of respective phase-change memory cells, and a plurality of thermally conductive patterns extending parallel to each other in a second direction and between adjacent phase-change regions of the plurality of phase-change material patterns.

According to another aspect of the present invention, a memory device is provided which includes an array of phase-change regions of respective phase-change memory cells aligned in rows and columns, and at least one thermally conductive element located between adjacent phase-changes region within in each row of the phase-change memory cells.

According to yet another aspect of the present invention, a memory device is provided which includes an insulating layer comprising first and second through-holes aligned over first and second electrodes, first and second programmable volumes located within the first and second through-holes, respectively, and a metal or metal alloy located within the insulating layer between the first and second programmable volumes.

According to still another aspect of the present invention, a portable electronic system is provided which includes a microprocessor, a power supply, and a non-volatile memory, where the non-volatile memory includes a thermally conductive material located between first and second programmable volumes of adjacent first and second memory cells.

BRIEF DESCRIPTION OF THE DRAWINGS

The above and other aspect and features of the present invention will become readily apparent from the detailed description that follows, with reference to the accompanying drawings, in which:

FIGS. 5A and 5B illustrate a core layout and a circuit diagram, respectively, of a memory device according to one or more embodiments of the present invention;

FIGS. 7A through 7C and FIG. 8 are cross-sectional views for use in explaining a method of fabricating the memory device of FIGS. 6A and 6B;

DETAILED DESCRIPTION OF EMBODIMENTS

The present invention will now be described by way of preferred, but non-limiting, embodiments of the invention. The embodiments are presented as examples only, and the invention is not considered to be limited to the specific configurations and/or features of the exemplary embodiments.

With respect to the drawings, embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Likewise, it will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items FIG. 4 is a conceptual diagram for explaining at least one aspect of one or more embodiments of the present invention.

Figure 1A:
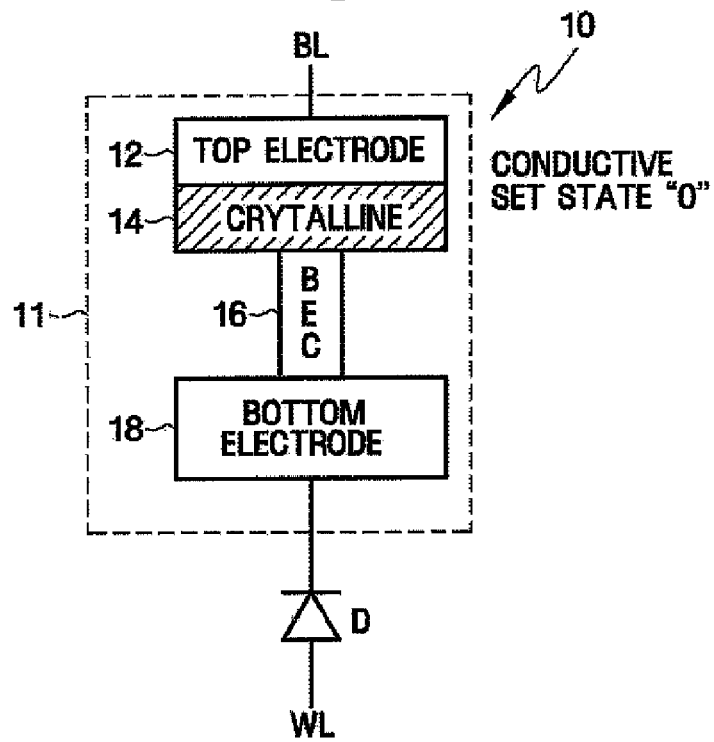
FIGS. 1A and 1B are schematic views illustrating a phase-change memory cell in set state and reset state, respectively.
Figure 1B:
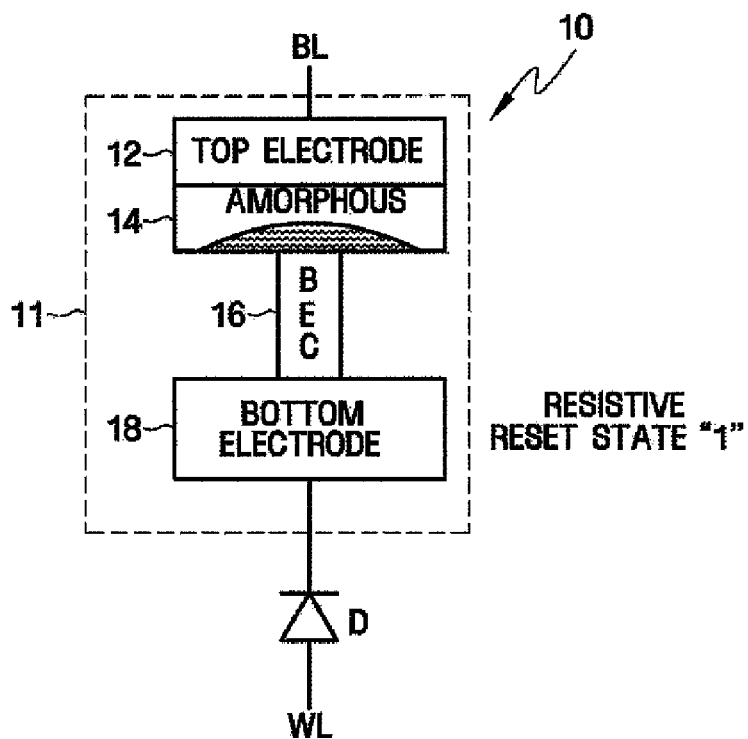
Figure 2:
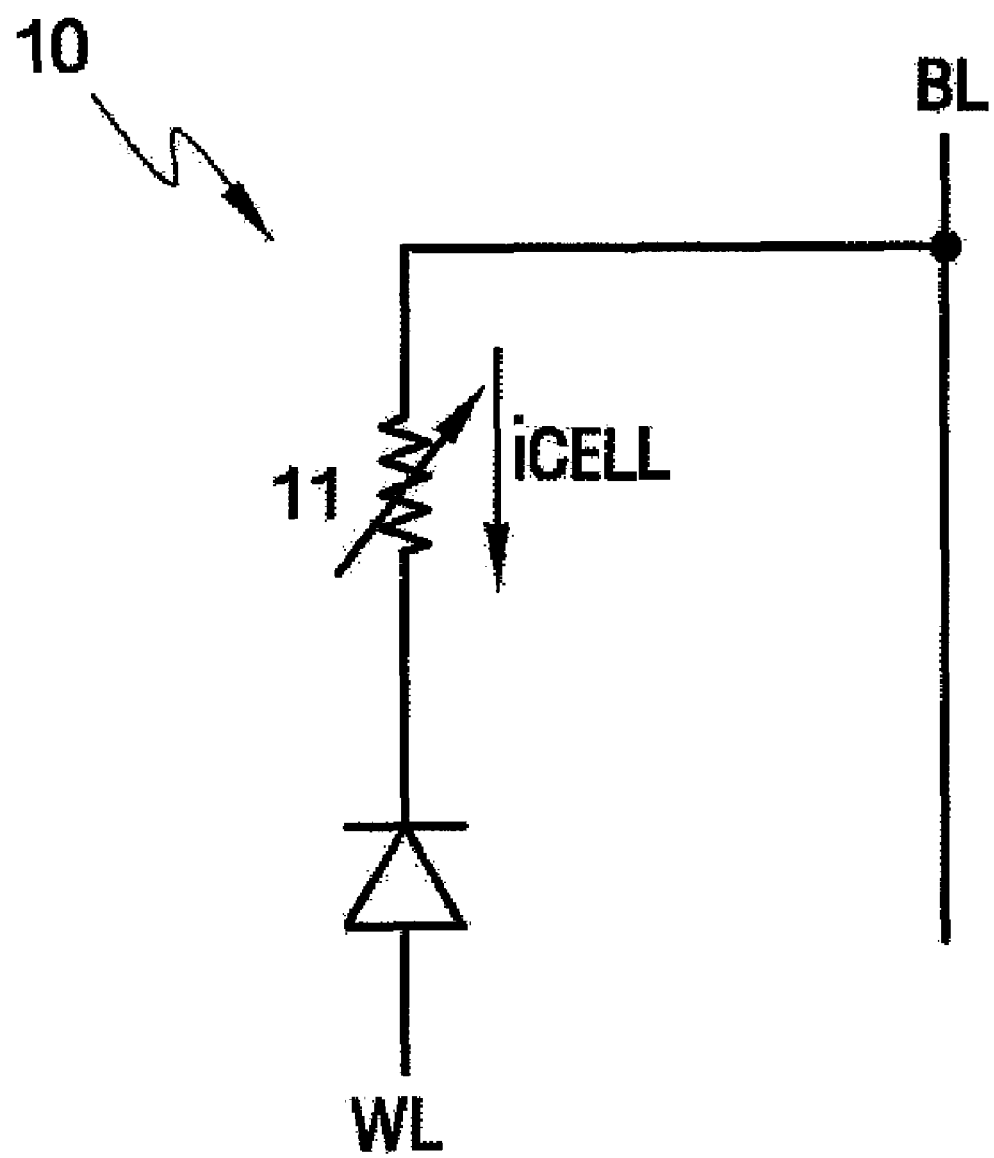
FIG. 2 is a circuit diagram of the phase-change memory cell.
Figure 3:
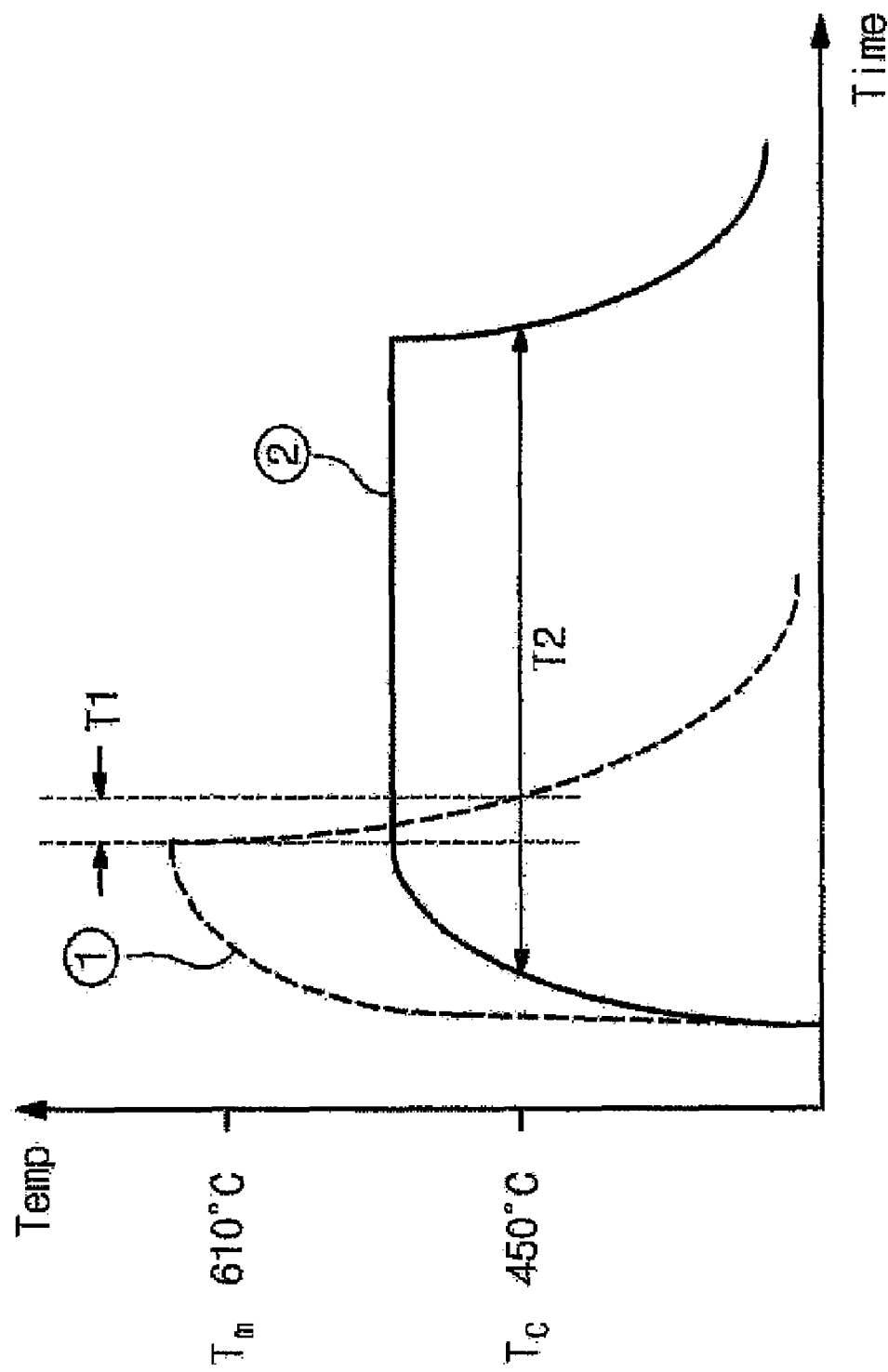
FIG. 3 is a graph illustrating thermal characteristics of a programmable volume when programming the volume in set and reset states.
Figure 4:
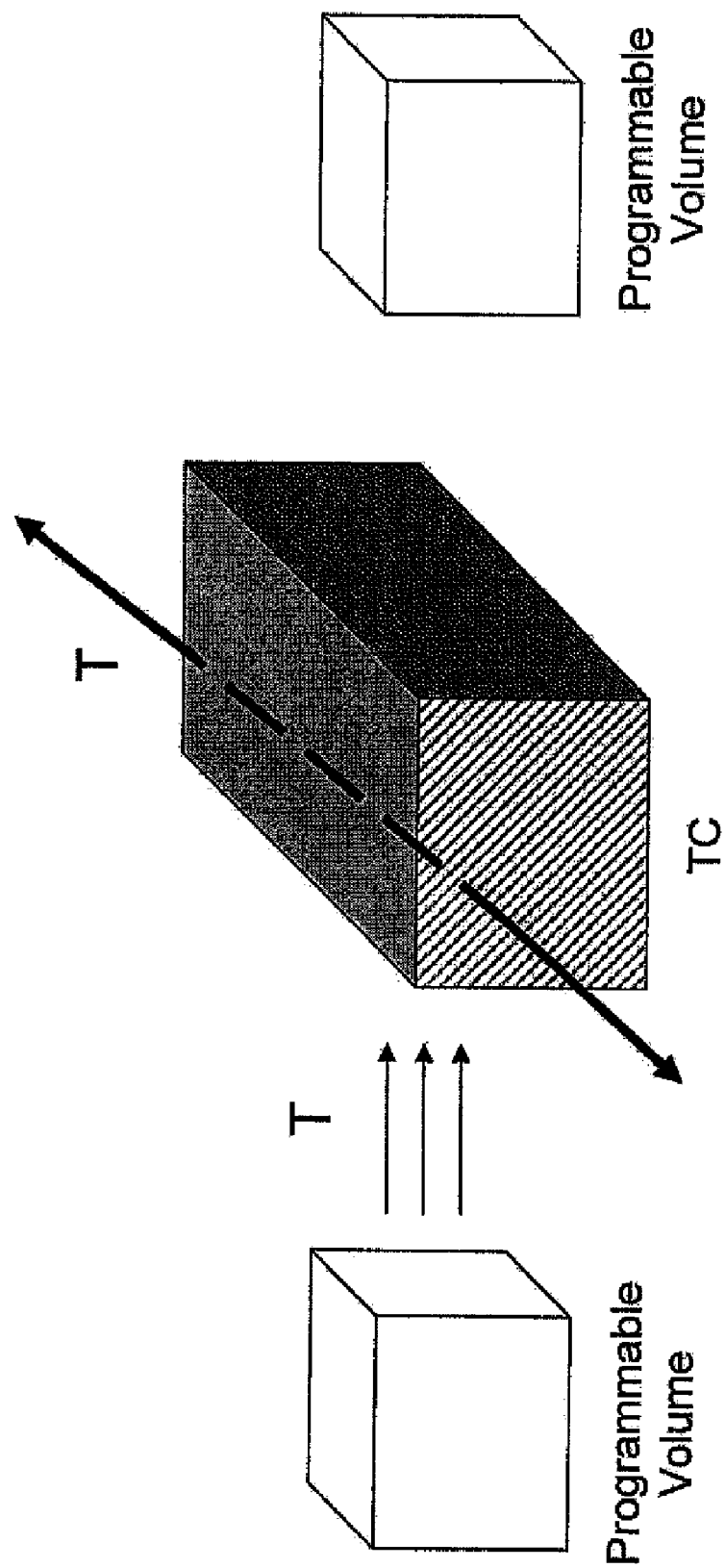
FIG. 4 is a conceptual diagram for explaining an aspect of one or more embodiments of the present invention.

In particular, FIG. 4 conceptually illustrates a pair of programmable volumes 400a and 400b of a memory device. As a non-limiting example, the programmable volumes 400a and 400b may form all or part of GST regions of memory cells of a PRAM device.

During programming, for example, of the programmable volume 400a, some of the thermal energy T emitted by the volume 400a propagates within the memory device towards the programmable volume 400b. In order to inhibit the resultant thermal interference, a thermal conductor TC is thermally interposed between the programmable volumes 400a and 400b. The thermal conductor TC acts as a heat sink, drawing all or part of the thermal energy T away from the programmable volume 400b.

Thermal interference which might otherwise adversely influence the program state of the programmable volume 400b is thereby inhibited.

The embodiments described below primarily relate to the use of a thermally conductive member as a heat sink between adjacent phase-change memory cells. It is noted, however, that the invention is not limited to application in the context of "phase-change" cells. Rather, the invention may be applied to any type of memory device in which the variable resistive memory cells include a programmable volume of material and in which thermal interference between cells is to be inhibited.

Figure 5B:
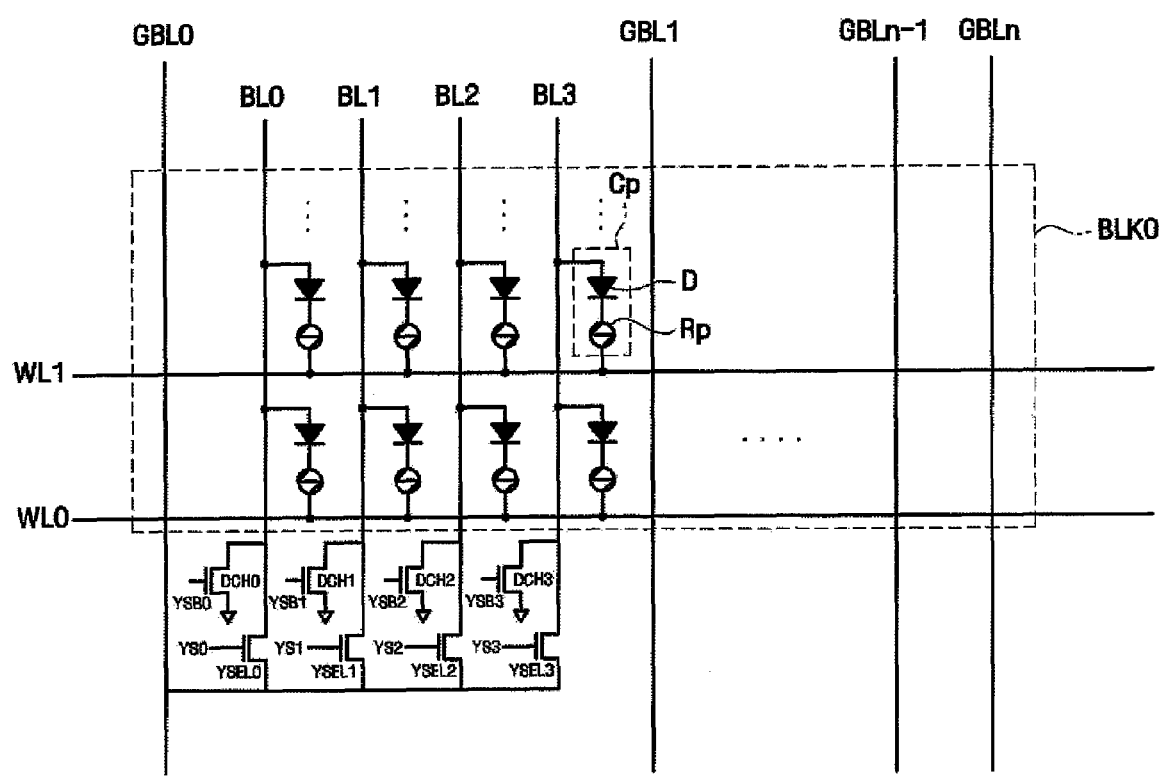

FIG. 5A illustrates an example of the core layout of a phase-change memory device according to an embodiment of the present invention, and FIG. 5B illustrates an example of a circuit portion of the phase-change memory device according to an embodiment of the present invention.

Referring to FIG. 5A, the core layout of this example includes sixteen (16) memory block regions 10_1 through 10_16. As shown in the figure, the memory blocks regions 10-1 through 10-8 are located on one side of the core area, and the memory blocks 10-9 through 10-16 are located on the other side of the core area. Each memory block region 10 includes eight (8) memory blocks BLK0 through BLK8, and each memory block BLK includes an array of phase-change memory cells connected to intersecting word lines and bit lines.

In the example of FIG. 5A, eight (8) sense amplifier/word line driver regions SA/WD regions 20_1 through 20-8 are provided, each operatively connected to two (2) of the memory block regions 10. Further, as shown in the figure, a periphery region 30 is centrally located within core area.

FIG. 5B illustrates a portion of the circuitry associated with memory block BLK0 of FIG. 5A. As shown, a plurality of memory cells Cp are connected in an array between word lines WL0 and WL1, and bit lines BL0 through BL3. In this example, each memory cell Cp includes a diode element D and a variable resistive element Rp. In this example, the variable resistive element Rp is a phase change cell including programmable volume of GST material.

The local bit lines BL0 through BL3 are selectively connected to a corresponding global bit line GBL0 of the memory block region 10. That is, in this example, each memory block region 10 includes n+1 global bit lines GBL0 through GBLn. In FIG. 5B, transistors DCH0 through DCH3 and YSEL0 through YSEL3 are access transistors responsive to address signals YSB0 through YSB3 and YS0 through YS3. Those skilled in the art will be well acquainted with the operation of these devices in the context of a PRAM device.

Figure 6A:
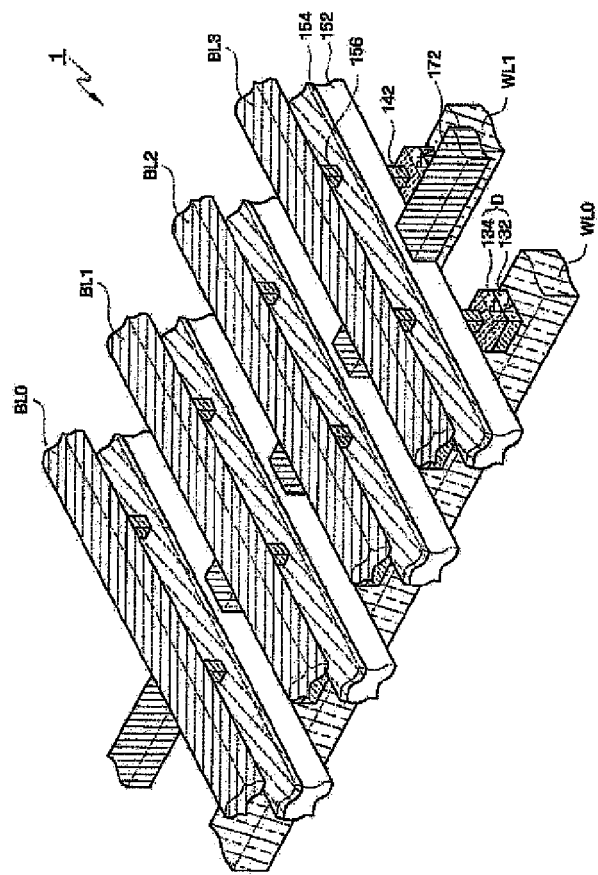
FIGS. 6A and 6B are a top view and a perspective view of a memory device according to an embodiment of the present invention.
Figure 6B:
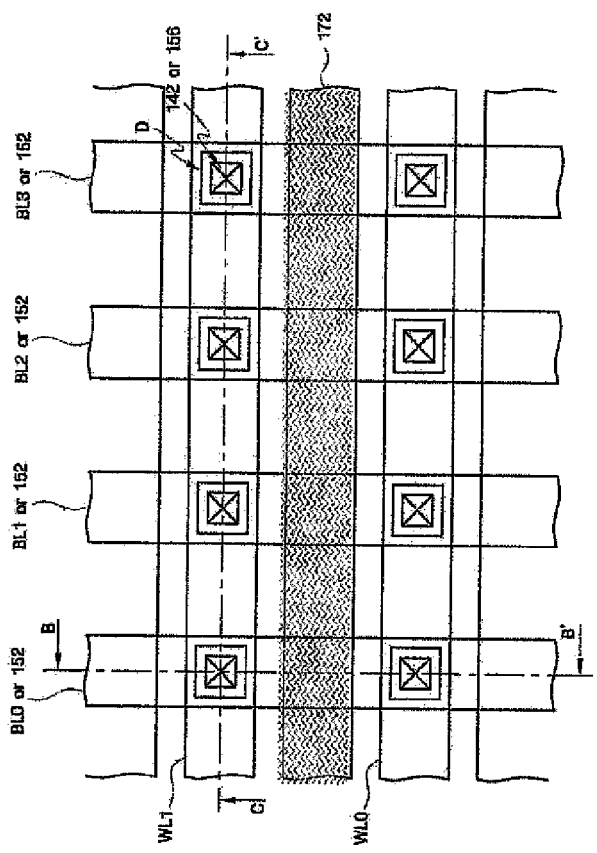

FIG. 6A is a top view of a phase-change memory device according to an embodiment of the present invention, and FIG. 6B is a perspective view of the same.

Referring to FIGS. 6A and 6B, the phase-change memory device of this example includes a plurality of word lines WL0 and WL1 extending lengthwise in a first direction, and a plurality of bit lines BL0 . . . BL3 extending lengthwise in a second direction substantially perpendicular to the first direction.

A plurality of GST striped patterns 152 extending lengthwise in the second direction are aligned below the bit lines BL0 . . . BL3. Each GST striped pattern 152 includes a plurality of thermally programmable volumes of respective memory cells of the memory device. In particular, each memory cell of this example includes a diode D (having an n-type region 132 and a p-type region 134) electrically coupled between a word line WL and a BEC element 142. The BEC element 142 is electrically coupled to the corresponding programmable volume of the GST striped pattern 152. Also, bit line contacts 156 are aligned over the BEC elements 142 and electrically coupled between a corresponding bit line BL and a GST contact pattern 154.

A thermally conductive striped pattern 172 extends lengthwise in the first direction (i.e., the word line direction), and traverses between the thermally programmable volumes of adjacent memory cells of each GST striped pattern 152. The thermally conductive striped pattern 172 functions as a heat sink to inhibit thermal interference between the adjacent memory cells within each GST striped pattern 152.

The thermally conductive striped pattern 172 may be formed of any material which exhibits suitable thermally conductive properties effective to inhibit thermal interference between the programmable volumes of adjacent memory cells. Suitable examples include metals such as aluminum and copper, and alloys of such metals. Preferably, the thermally conductive material has a thermal conductivity of 150 W/mK or more, more preferably a thermal conductivity of 200 W/mK or more, and most preferably a thermal conductivity of 300 W/mK or more.

Figure 7B:
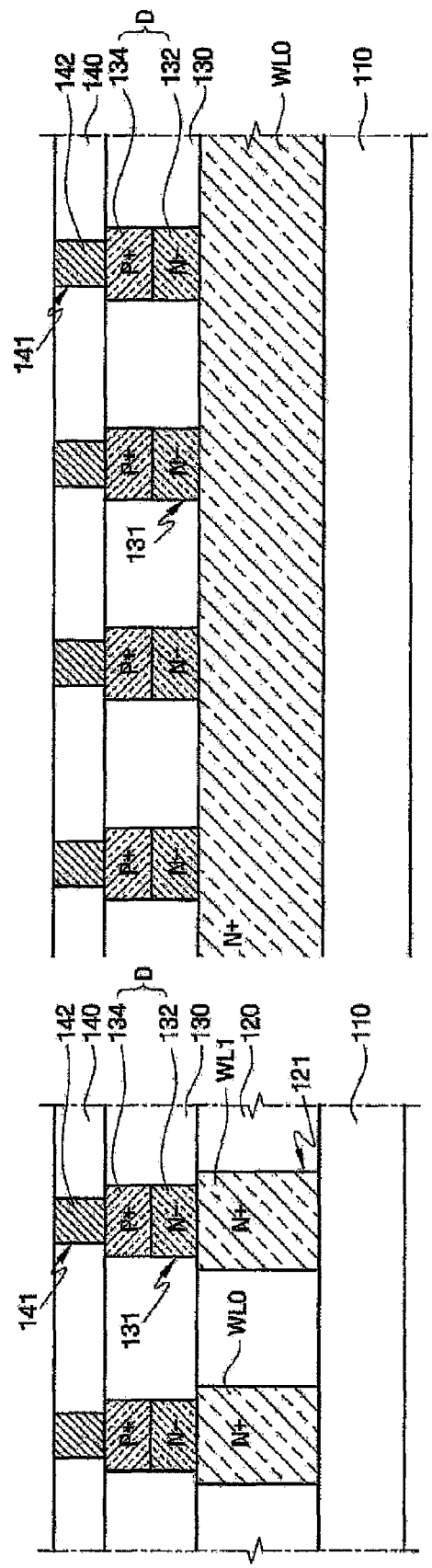
Figure 8:
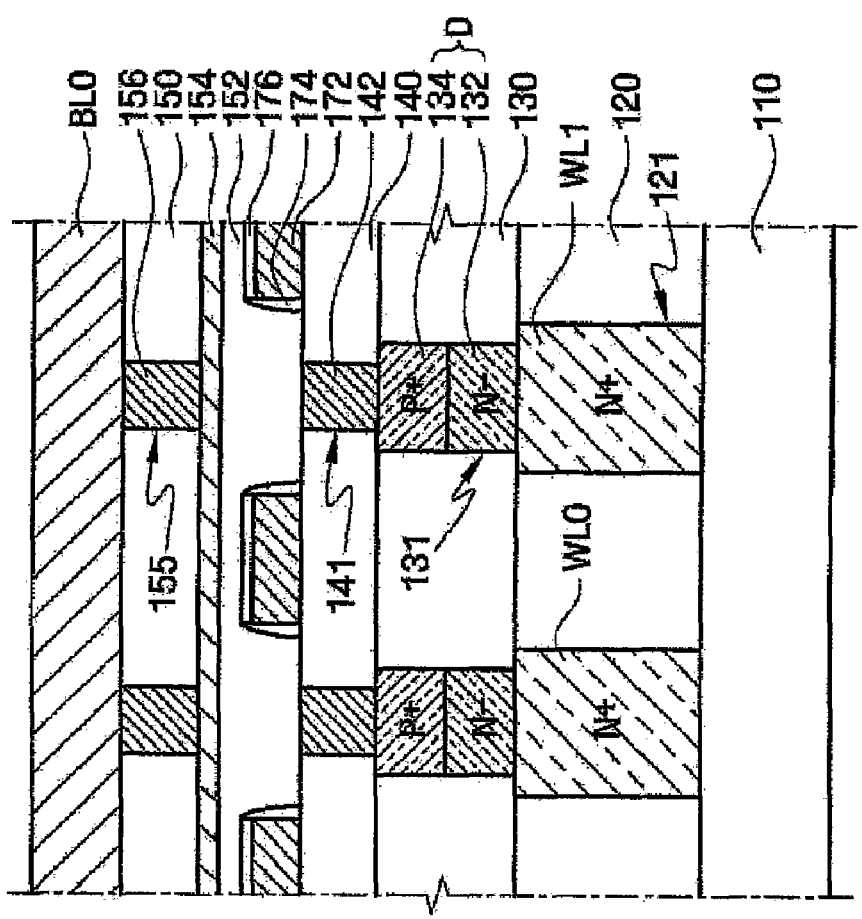

FIGS. 7A through 7C and FIG. 8 are cross-sectional views for reference in explaining an exemplary method of fabricating the memory device of FIGS. 6A and 6B. FIG. 8 and the left view of each of FIGS. 7A through 7C corresponds to line B-B' of FIG. 6A, whereas the right-side view of each of FIGS. 7A through 7C corresponds to line C-C' of FIG. 6A.

Referring to FIG. 7A, conductive N+ type semiconductor striped regions 121 are formed in a layer 120 located over a substrate 110. Each N+ type semiconductor striped regions 121 defines a word line WL of the memory device. A layer 130 is formed over the layer 120, such that the layer 130 includes a plurality of diode formation holes 131 located over each of the N+ type semiconductor striped regions 121. The layers 120 and 130 may, for example, be formed of an insulating material.

Referring to FIG. 7B, the diode formation holes 131 are filled with an N– type semiconductor 132 and a P+ type semiconductor 134 to thereby define a diode D within each hole 131. A layer 140 is formed over the layer 130, such that the layer 130 includes a plurality of BEC formation holes 141 aligned over the diodes D. The layer 140 may, for example, be formed of an insulating material. The BEC formations holes are filled with a BEC material to thereby define a BEC 142 within each hole 141.

Referring to FIG. 7C, a plurality of thermally conductive striped patterns 172 are formed over the layer 140. The striped patterns 172 are aligned above and between the N+ type semiconductor striped regions 121 defining the word lines WL. Each thermally conductive striped pattern 172 is surrounded by insulating side walls 174 and insulating top walls 176.

Turning now to FIG. 8, GST striped patterns 152 are formed over the layer 140 and the thermally conductive striped patterns 172. The GST striped patterns 152 extend perpendicular to the word lines WL. As such, the thermally conductive stripped patterns 172 are located between programmable volumes of the GST striped patterns 152 defined over each BEC 142. A contact layer pattern 154 is then formed over each GST striped pattern 152, and bit line contacts 156 are formed within bit line contacts holes 155 of an insulating layer 150. Finally, a bit line BL is formed over the insulating layer 150 and aligned with the GST striped pattern 152.

The embodiment described above in connection with FIGS. 6A through 8 is presented as an example only of the present invention, and variations thereof which fall within the scope and spirit of the invention will be readily apparent to those skilled in the art. Examples of such variations are presented below, but the invention is not considered limited thereto.

Figure 9B:
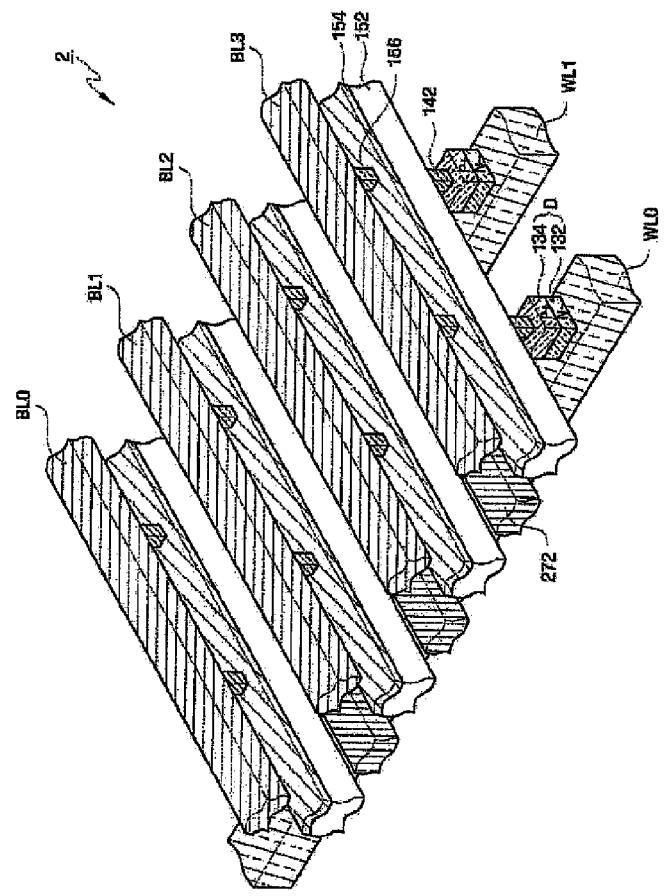
FIGS. 9A and 9B are a top view and a perspective view of a memory device according to an embodiment of the present invention.
Figure 9A:
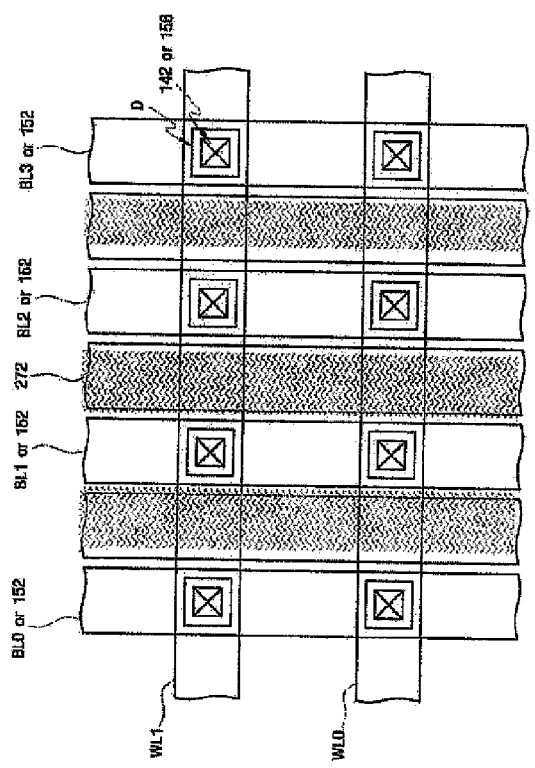

FIGS. 9A and 9B illustrate another embodiment of the invention in which the thermally conductive striped patterns are located between the GST striped patterns and extend parallel to the bit lines BL. In this manner, thermal interference between programmable volumes contained in adjacent GST striped patterns is inhibited. FIG. 9A is a top view of a phase-change memory device according to this embodiment of the present invention, and FIG. 9B is a perspective view of the same.

In particular, referring to FIGS. 9A and 9B, the phase-change memory device of this example includes a plurality of word lines WL0 and WL1 extending lengthwise in a first direction, and a plurality of bit lines BL0 . . . BL3 extending lengthwise in a second direction substantially perpendicular to the first direction.

A plurality of GST striped patterns 152 extending lengthwise in the first direction are aligned below the bit lines BL0 . . . BL3. Each GST striped pattern 152 includes a plurality of thermally programmable volumes of respective memory cells of the memory device. In particular, each memory cell of this example includes a diode D (having an n-type region 132 and a p-type region 134) electrically coupled between a word line WL and a BEC element 142. The BEC element 142 is electrically coupled to the corresponding programmable volume of the GST striped pattern 152. Also, bit line contacts 156 are aligned over the BEC elements 142 and electrically coupled between a corresponding bit line BL and a GST contact pattern 154.

Thermally conductive striped patterns 272 extend lengthwise in the second direction (i.e., the bit line direction), and respectively traverse between and parallel to adjacent pairs of GST striped patterns 152. The thermally conductive striped patterns 272 function as a heat sink to inhibit thermal interference between the memory cells of adjacent pairs of GST striped patterns 152.

The thermally conductive striped pattern 272 may be formed of any material which exhibits suitable thermally conductive properties effective to inhibit thermal interference between the programmable volumes of adjacent memory cells of adjacent GST striped patterns 152. Suitable examples include metals such as aluminum and copper, and alloys of such metals. Preferably, the thermally conductive material has a thermal conductivity of 150 W/mK or more, more preferably a thermal conductivity of 200 W/mK or more, and most preferably a thermal conductivity of 300 W/mK or more.

Figure 10B:
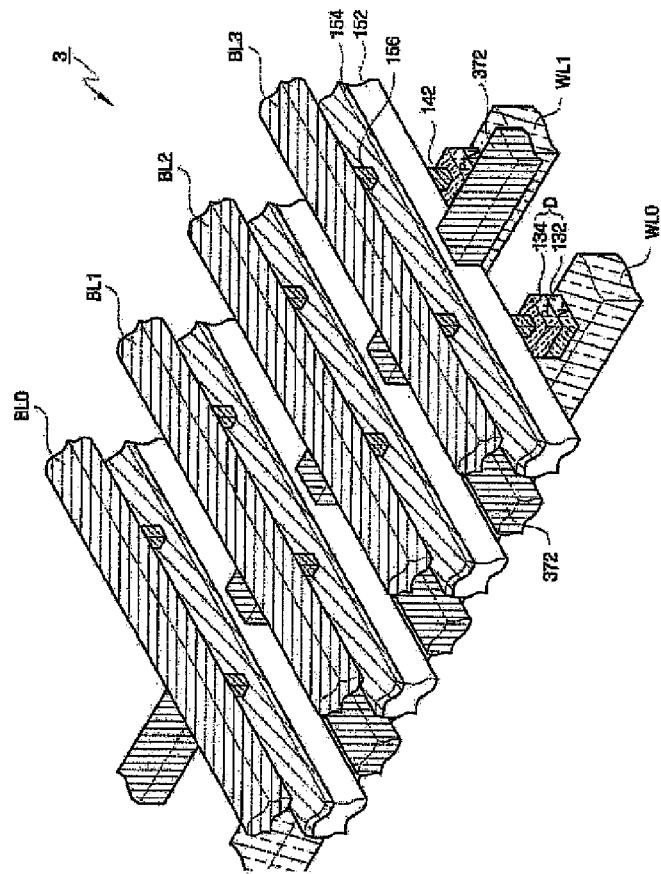
FIGS. 10A and 10B are a top view and a perspective view of a memory device according to an embodiment of the present invention.
Figure 10A:
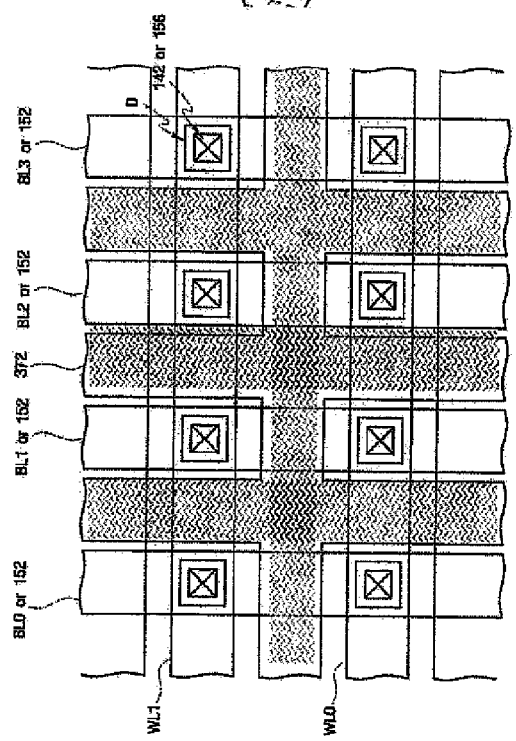

FIGS. 10A and 10B illustrate another embodiment of the invention in which a crisscross type thermally conductive pattern is provided which includes elongate members extending both in the word line direction and the bit line direction. In this manner, thermal interference between programmable volumes contained in adjacent GST striped patterns is inhibited, and thermal interference between programmable volumes contained in the same GST striped patterns is inhibited. FIG. 10A is a top view of a phase-change memory device according to this embodiment of the present invention, and FIG. 10B is a perspective view of the same.

In particular, referring to FIGS. 10A and 10B, the phase-change memory device of this example includes a plurality of word lines WL0 and WL1 extending lengthwise in a first direction, and a plurality of bit lines BL0 . . . BL3 extending lengthwise in a second direction substantially perpendicular to the first direction.

A plurality of GST striped patterns 152 extending lengthwise in the first direction are aligned below the bit lines BL0 . . . BL3. Each GST striped pattern 152 includes a plurality of thermally programmable volumes of respective memory cells of the memory device. In particular, each memory cell of this example includes a diode D (having an n-type region 132 and a p-type region 134) electrically coupled between a word line WL and a BEC element 142. The BEC element 142 is electrically coupled to the corresponding programmable volume of the GST striped pattern 152. Also, bit line contacts 156 are aligned over the BEC elements 142 and electrically coupled between a corresponding bit line BL and a GST contact pattern 154.

A thermally conductive crisscross pattern 372 includes first elongate members extending lengthwise in the second direction (i.e., the bit line direction), and respectively traversing between and parallel to adjacent pairs of GST striped patterns 152, and second elongate members extending lengthwise in the first direction (i.e., the word line direction), and traversing between the thermally programmable volumes of adjacent memory cells of each GST striped pattern 152. The first members of the thermally conductive crisscross pattern 372 function as a heat sink to inhibit thermal interference between the memory cells of adjacent pairs of GST striped patterns 152. The second members of the thermally conductive crisscross pattern 372 function as a heat sink to inhibit thermal interference between the adjacent memory cells within each GST striped pattern 152.

The thermally conductive crisscross pattern 372 may be formed of any material which exhibits suitable thermally conductive properties effective to inhibit thermal interference between the programmable volumes of adjacent memory cells. Suitable examples include metals such as aluminum and copper, and alloys of such metals. Preferably, the thermally conductive material has a thermal conductivity of 150 W/mK or more, more preferably a thermal conductivity of 200 W/mK or more, and most preferably a thermal conductivity of 300 W/mK or more.

Figure 11:
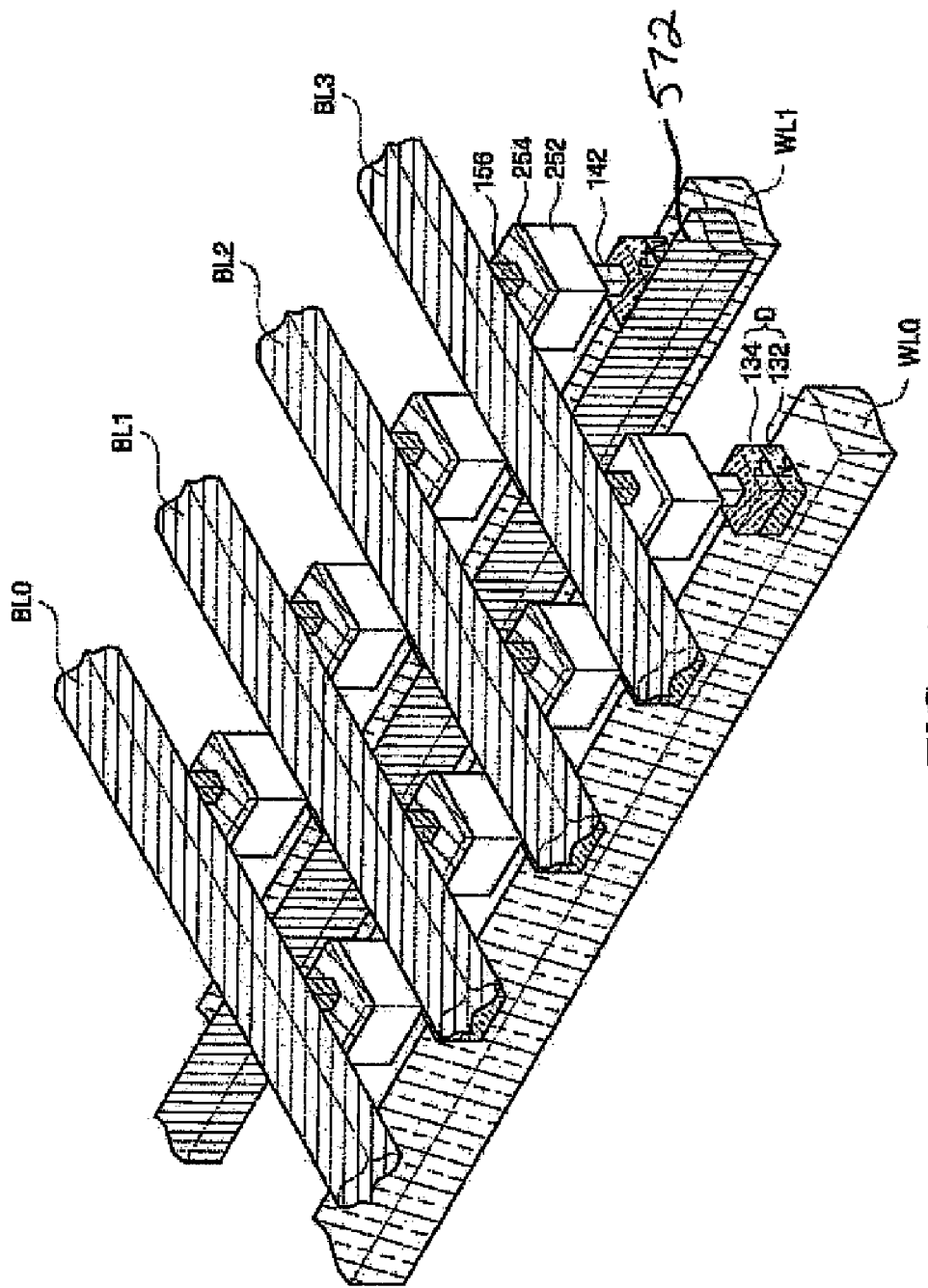
FIG. 11 is a perspective view of a memory device according to an embodiment of the present invention.

FIG. 11 illustrates another embodiment of the invention in which island-type GST regions are provided (instead of the striped GST patterns of the previous embodiments).

In particular, referring to FIG. 11, the phase-change memory device of this example includes a plurality of word lines WL0 and WL1 extending lengthwise in a first direction, and a plurality of bit lines BL0 . . . BL3 extending lengthwise in a second direction substantially perpendicular to the first direction.

A plurality of GST islands 252 between intersecting regions of the bit lines BL and word lines WL. Each GST island 252 includes a plurality of thermally programmable volumes of respective memory cells of the memory device. In particular, each memory cell of this example includes a diode D (having an n-type region 132 and a p-type region 134) electrically coupled between a word line WL and a BEC element 142. The BEC element 142 is electrically coupled to the corresponding programmable volume of the GST island 252. Also, bit line contacts 156 are aligned over the BEC elements 142 and electrically coupled between a corresponding bit line BL and a GST contact 254.

A thermally conductive striped pattern 172 extends lengthwise in the first direction (i.e., the word line direction). The thermally conductive striped pattern 172 traverses between the thermally programmable volumes of adjacent memory cells of the GST islands 252 so as to inhibit thermal interference therebetween.

The thermally conductive striped pattern 172 may be formed of any material which exhibits suitable thermally conductive properties effective to inhibit thermal interference between the programmable volumes of adjacent memory cells. Suitable examples include metals such as aluminum and copper, and alloys of such metals. Preferably, the thermally conductive material has a thermal conductivity of 150 W/mK or more, more preferably a thermal conductivity of 200 W/mK or more, and most preferably a thermal conductivity of 300 W/mK or more.

As should be apparent, the thermally conductive striped pattern 272 of the embodiment of FIGS. 9A and 9B, or the thermally conductive crisscross pattern 372 of the embodiment of FIGS. 10A and 10B, may also be applied to a GST island type configuration such as that illustrated in FIG. 11.

Figure 12:
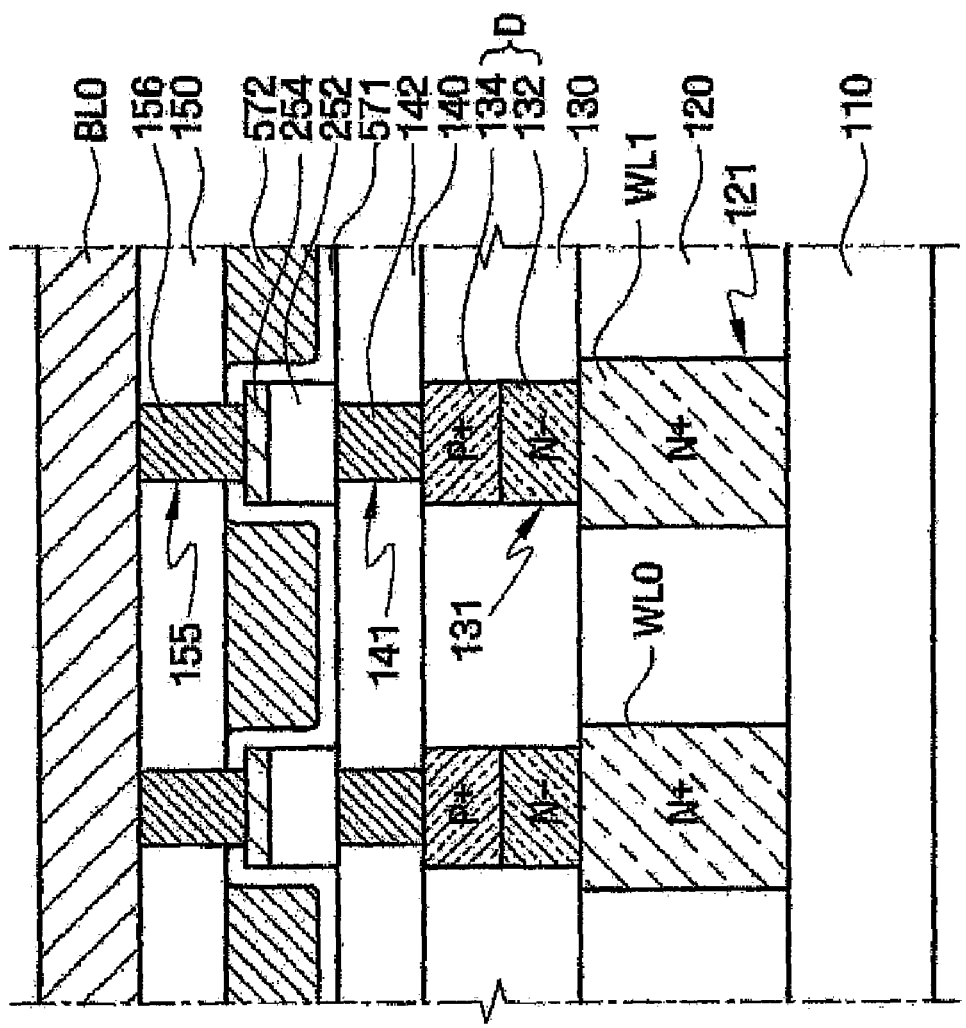
FIG. 12 is an example of a cross-sectional view of the memory device shown in FIG. 11.

FIG. 12 is an example of a cross-sectional view of the embodiment shown in FIG. 11.

Referring to FIG. 12, conductive N+ type semiconductor striped regions 121 are formed in a layer 120 located over a substrate 110. Each N+ type semiconductor striped regions 121 defines a word line WL of the memory device. A layer 130 is formed over the layer 120, such that the layer 130 includes a plurality of diode formation holes 131 located over each of the N+ type semiconductor striped regions 121. The layers 120 and 130 may, for example, be formed of an insulating material.

Diode formation holes 131 are filled with an N− type semiconductor 132 and a P+ type semiconductor 134 to thereby define a diode D within each hole 131. A layer 140 is formed over the layer 130, such that the layer 130 includes a plurality of BEC formation holes 141. The layer 140 may, for example, be formed of an insulating material. The BEC formations holes are filled with a BEC material to thereby define a BEC 142 within each hole 141.

GST islands 252 and GST contact layers 254 are formed over the layer 140 so as to be aligned with the BEC regions 142. A conformal insulating layer 571 is formed over the resultant structure, and thermally conductive strip patterns 572 so as to be aligned between the GST islands 252. Bit line contacts 156 are formed within bit line contacts holes 155 of an insulating layer 150. Finally, a bit line BL is formed over the insulating layer 150.

In the embodiments described above, the thermally conductive heat sink patterns are substantially co-planar with (i.e., lie a same plane as) the adjacent programmable volumes for which thermal interference is to be inhibited. However, the invention is not limited in this respect.

Figure 13:
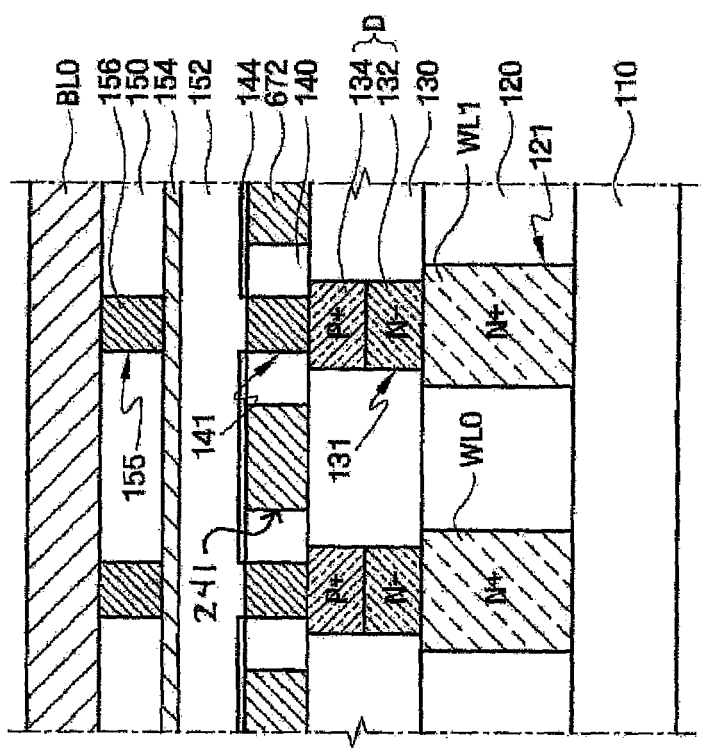

For example, FIG. 13 illustrates a cross-sectional view in which the thermally conductive heat sink pattern is located in a plane below (relative to the substrate) the programmable volume of the GST material.

Referring to FIG. 13, conductive N+ type semiconductor striped regions 121 are formed in a layer 120 located over a substrate 110. Each N+ type semiconductor striped regions 121 defines a word line WL of the memory device. A layer 130 is formed over the layer 120, such that the layer 130 includes a plurality of diode formation holes 131 located over each of the N+ type semiconductor striped regions 121. The layers 120 and 130 may, for example, be formed of an insulating material.

The diode formation holes 131 are filled with an N− type semiconductor 132 and a P+ type semiconductor 134 to thereby define a diode D within each hole 131. A layer 140 is formed over the layer 130, such that the layer 130 includes a plurality of BEC formation holes 141 and a plurality of pattern trenches 241. In this example, the pattern trenches extend parallel to the word lines WL. The layer 140 may, for example, be formed of an insulating material. The BEC formations holes 141 are filled with a BEC material to thereby define a BEC 142 within each hole 141. Further, the pattern trenches 241 are filled with a thermally conductive material to define a plurality of thermally conductive striped patterns 672.

An insulating layer 144 is formed over the resultant structure so as to expose the BEC regions 142, and a GST striped pattern 152 is formed thereon. The GST striped patterns 152 extend perpendicular to the word lines WL. As such, the thermally conductive stripped patterns 672 are located between and below (relative to the substrate 110) the programmable volumes of the GST striped patterns 152 defined over each BEC 142. A contact layer pattern 154 is then formed over each GST striped pattern 152, and bit line contacts 156 are formed within bit line contacts holes 155 of an insulating layer 150. Finally, a bit line BL is formed over the insulating layer 150 and aligned with the GST striped pattern 152.

Figure 14:
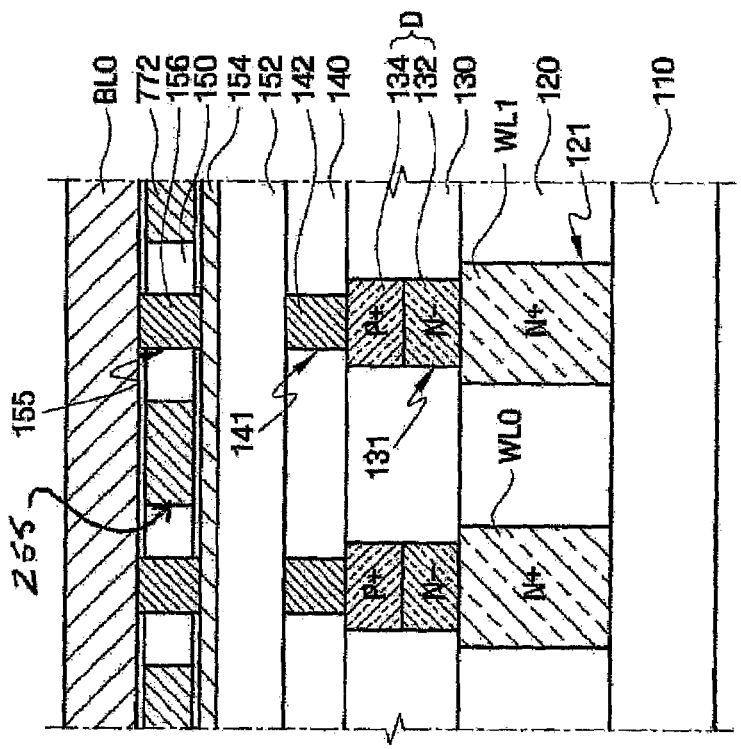
FIGS. 13 and 14 are cross-sectional views of memory device according to embodiments of the present invention.

FIG. 14 is a cross-sectional view illustrating another example in which thermally conductive heat sink pattern is located in a plane above (relative to the substrate) the programmable volume of the GST material.

Referring to FIG. 14, conductive N+ type semiconductor striped regions 121 are formed in a layer 120 located over a substrate 110. Each N+ type semiconductor striped regions 121 defines a word line WL of the memory device. A layer 130 is formed over the layer 120, such that the layer 130 includes a plurality of diode formation holes 131 located over each of the N+ type semiconductor striped regions 121. The layers 120 and 130 may, for example, be formed of an insulating material.

The diode formation holes 131 are filled with an N− type semiconductor 132 and a P+ type semiconductor 134 to thereby define a diode D within each hole 131. A layer 140 is formed over the layer 130, such that the layer 130 includes a plurality of BEC formation holes 141. The layer 140 may, for example, be formed of an insulating material. The BEC formations holes 141 are filled with a BEC material to thereby define a BEC region 142 within each hole 141.

A GST striped pattern 152 and a GST contact layer pattern 154 are formed on the resultant structure as shown in FIG. 14. The GST striped patterns 152 extend perpendicular to the word lines WL.

A layer 150 is located over the GST contact layer pattern 154 and includes bit line contact holes 155 and a plurality of pattern trenches 255. In this example, the pattern trenches 255 extend parallel to the word lines WL. The layer 150 may, for example, be formed of an insulating material. The bit line contact holes 155 are filled with bit line contacts 156. Further, the pattern trenches 255 are filled with a thermally conductive material to define a plurality of thermally conductive patterns 772. As such, the thermally conductive stripped patterns 772 are located between and above (relative to the substrate 110)

the programmable volumes of the GST striped patterns 152 defined over each BEC 142. In the example of FIG. 14, the thermally conductive patterns 772 are electrically isolated form the bit line GL and the contact layer pattern 154 by a thin insulating layer (unnumbered in the drawings).

Finally, a bit line BL is formed over the insulating layer 150 and aligned with the GST striped pattern 152.

Figure 15:
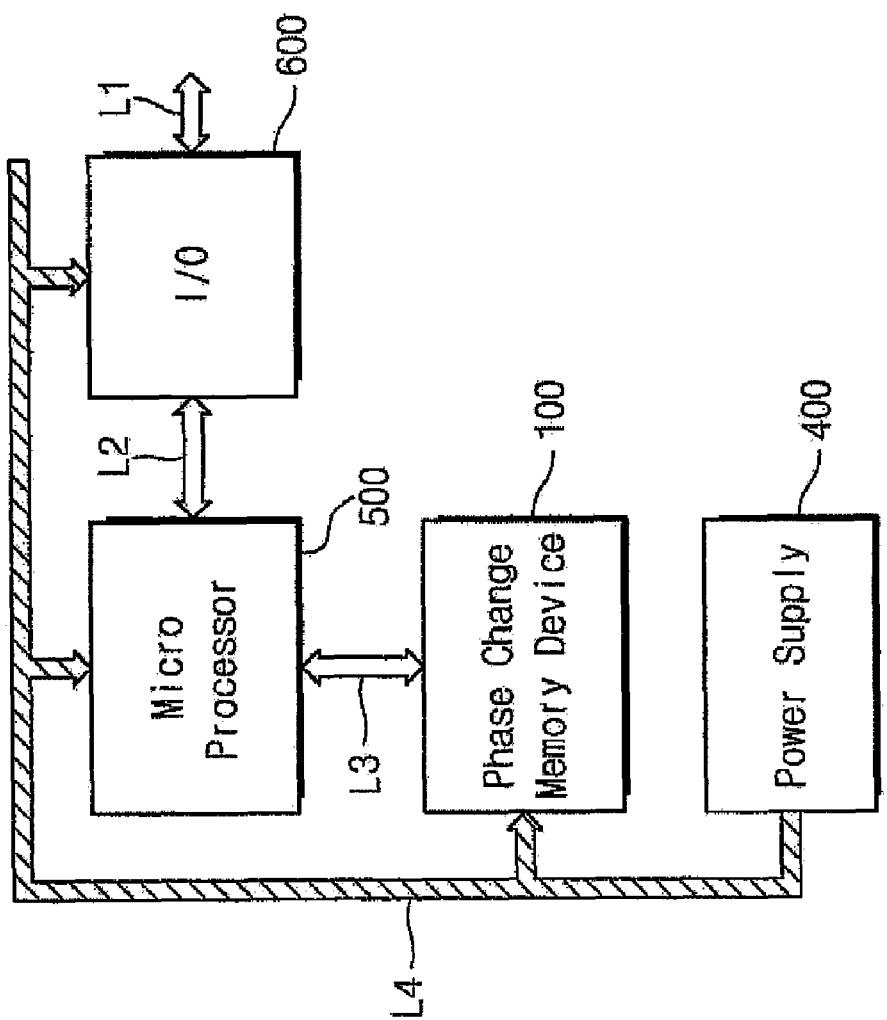
FIG. 15 is a block diagram of a portable electronic system including a memory device of the present invention.

FIG. 15 is a block diagram of a portable electronic system adopting a phase change memory device 100 according to another embodiment of the present invention. Non-limiting examples of the portable electronic system include mobile telephones, personal data assistants (PDA's), mp3 players, digital cameras, and hybrids of such devices.

The phase change memory device 100 includes a thermal conductive member for inhibiting thermal interference between memory cells, and is connected to a microprocessor 500 through a bus line L3, serving as a main memory of the portable electronic system. A battery 400 supplies a power to the microprocessor 5001 an input output device (I/O) 600, and the phase change memory device 100 through a power line L4. If data is provided to the I/O 600 through a line L1 the microprocessor 500 transfers the data to the phase change memory device 100 through a line L3 after receiving and processing the data. The phase change memory device 100 stores the transferred data in a memory cell. The data stored in the memory cell is read out by the microprocessor 500 and output to the outside through the I/O 600.

Even when the power of the battery 400 is not supplied, the data stored in the memory cell of the phase change memory device 100 is not lost due to the non-volatile characteristics of the phase change memory cells. Moreover, the phase change memory device 100 exhibits other advantages such as higher speed and lower power consumption when compared to other types of memory devices.

While the present invention has been particularly shown and described with reference to exemplary embodiments thereof, it will be understood by those of ordinary skill in the art that various changes in form and details may be made therein without departing from the spirit and scope of the invention as defined by the appended claims and their equivalents.

What is claimed is:

1. A memory device comprising:
a plurality of bit lines extending in a first direction;
a plurality of word lines extending in a second direction;
an array of programmable volumes electrically connected between the bit lines and word lines; and
thermally conductive striped patterns located between the programmable volumes of the array and extending in at least one of the first and second directions,
wherein the thermally conductive striped patterns do not contact the programmable volumes of the array.

2. The memory device of claim 1, further comprising a plurality of striped phase-change material patterns, wherein each striped phase-change material pattern includes a plurality of the programmable volumes of the array.

3. The memory device of claim 2, wherein the striped phase-change material patterns are located between the bit lines and the word lines, and extend in the first direction aligned with the bit lines, respectively.

4. The memory device of claim 3, wherein the thermally conductive striped patterns extend in the second direction and intersect the striped phase-change material patterns.

5. The memory device of claim 3, wherein the thermally conductive striped patterns extend in the first direction between the striped phase-change material patterns.

6. The memory device of claim 3, wherein the thermally conductive striped patterns extend both in the first direction between the striped phase-change material patterns, and in the second direction so as to intersect the striped phase-change material patterns.

7. The memory device of claim 1, further comprising a plurality of phase-change material islands, wherein each phase-change material island includes a programmable volume of the array.

8. The memory device of claim 1, wherein the array of programmable volumes is located between the bit lines and the word lines, and wherein the memory device further comprises an access device electrically connected between each programmable volume and one of the word lines.

9. The memory device of claim 8, wherein the access device is a diode.

10. The memory device of claim 8, wherein the thermally conductive striped patterns are located in a same plane as the array of the programmable volumes.

11. The memory device of claim 1, wherein the thermally conductive striped patterns comprise a metal and are electrically insulated from the array of programmable volumes.

12. A memory device comprising a thermally conductive material located between first and second programmable volumes of adjacent first and second memory cells, wherein the thermally conductive material does not contact the first and second programmable volumes.

13. The memory device of claim 12, wherein the first and second programmable volumes are located in respective first and second phase-change material regions of the first and second memory cells.

14. The memory device of claim 12, wherein the thermally conductive material is coplanar with the first and second programmable volumes.

15. The memory device of claim 12, wherein each of the first and second memory cells includes a first electrode and a second electrode located on opposite sides of the programmable volume, wherein the thermally conductive material is located in a plane of one of the first and second electrodes of the first and second phase change memory cells.

16. The memory device of claim 13, wherein the first and second phase-change regions are contained in a same phase-change material pattern.

17. The memory device of claim 13, wherein the first and second phase-change regions are contained in different phase-change material patterns.

18. The memory device of claim 12, wherein the thermally conductive material includes a metal.

19. The memory device of claim 18, further comprising an insulating layer electrically interposed between the thermally conductive material and the first and second programmable volumes.

20. The memory device of claim 13, wherein the phase-change material regions include a chalcogenide material.

21. A memory device comprising a continuous phase-change material pattern extending between adjacent first and second phase-change memory cells, and a thermally conductive pattern embedded in the phase-change material pattern between the first and second phase-change memory cells.

22. The memory device of claim 21, wherein the thermally conductive pattern includes a metal.

23. The memory device of claim 22, further comprising an insulating layer located between the phase-change material pattern and the thermally conductive pattern embedded in the phase-change material.

24. A memory device, comprising:
- a plurality of phase-change material patterns extending parallel to each other in a first direction, each of the phase-change material patterns including a plurality of phase-change regions of respective phase-change memory cells; and
- a plurality of thermally conductive patterns extending parallel to each other in a second direction and between adjacent phase-change regions of the plurality of phase-change material patterns,
- wherein the thermally conductive patterns do not contact the phase-change material patterns.

25. The memory device of claim 24, wherein the first direction is perpendicular to the second direction such that the thermally conductive patterns extend between adjacent phase-change regions included in a same phase-change material pattern.

26. The memory device of claim 24, wherein the first direction is parallel to the second direction such that the thermally conductive patterns extend between adjacent phase-change regions included in different phase-change material patterns.

27. The memory device of claim 24, wherein the plurality of phase-change material patterns and the plurality of thermally conductive patterns are coplanar.

28. The memory device of claim 24, further comprising at least one insulating layer which electrically isolates the plurality of phase-change material patterns from the plurality of thermally conductive patterns.

29. The memory device of 25, wherein the plurality of thermally conductive patterns is a first plurality of thermally conductive patterns, and
- wherein the phase-change memory further comprises a second plurality of thermally conductive patterns which extend in the first direction so as to intersect the first plurality of thermally conductive patterns, the second thermally conductive patterns extending between adjacent phase-change regions included in different phase-change material patterns.

30. A memory device comprising:
- an array of phase-change regions of respective phase-change memory cells aligned in rows and columns; and
- at least one thermally conductive element located between adjacent phase-change regions within in each row of the phase-change memory cells,
- wherein the thermally conductive element does not contact the adjacent phase-change regions.

31. The memory device of claims 30, wherein the at least one thermally conductive element is further located between adjacent phase-change regions within each column of the phase-change memory cells.

32. The memory device of claim 30, wherein the at least one thermally conductive element is coplanar with the array of phase-change regions.

33. The memory device of claim 30, wherein the at least one thermally conductive element includes a plurality of thermally conductive patterns extending between adjacent columns of the phase-change memory cells.

34. The memory device of claim 31, wherein the at least one thermally conductive elements includes a first plurality of thermally conductive patterns extending between adjacent columns of the phase-change memory cells, and a second plurality of thermally conductive patterns extending between adjacent rows of the phase-change memory cells.

35. A memory device comprising:
- an insulating layer comprising first and second through-holes aligned over first and second electrodes;
- first and second programmable volumes located within the first and second through-holes, respectively; and
- a metal or metal alloy which is located between the first and second programmable volumes and which is electrically isolated from the first and second programmable volumes.

36. The memory device of claim 35, further comprising a phase change material layer located over the insulating layer and extending within the first and second through-holes, wherein the first and second programmable volumes form part of the phase change material layer.

37. The memory device of claim 35, wherein the first and second electrodes are bottom electrode contact (BEC) electrodes.

38. A portable electronic system comprising a microprocessor, a power supply, and a non-volatile memory, the non-volatile memory comprising a thermally conductive material located between first and second programmable volumes of adjacent first and second memory cells, wherein the thermally conductive material does not contact the first and second programmable volumes.

* * * * *